(12) United States Patent
Yoshihara (10) Patent No.: US 6,243,318 B1
(45) Date of Patent: Jun. 5, 2001

(54) DECODER CIRCUIT (75) Inventor: Kazuo Yoshihara, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/597,559

(22) Filed: Jun. 20, 2000

(30) Foreign Application Priority Data

Jun. 25, 1999 (JP) .................................................. 11-180543

(51) Int. Cl.[7] .................................................. G11C 8/00
(52) U.S. Cl. ..................................... 365/230.06; 326/106
(58) Field of Search ........................ 365/230.06; 326/105, 326/106

(56) References Cited

U.S. PATENT DOCUMENTS 5,546,352 * 8/1996 Sato et al. ........................ 365/230.06
5,949,735 * 9/1999 Jeong ............................... 365/230.06

* cited by examiner

Primary Examiner—Vu A. Le
Assistant Examiner—VanThu Nguyen
(74) Attorney, Agent, or Firm—Young & Thompson (57) ABSTRACT

A decoder circuit quickly switches an output signal thereof. The decoder circuit, which decodes a plurality of input address signals to output a decoded signal on an output terminal, comprises a switch circuit that receives the address signals and connects a node to a ground line or cuts off the node from the ground line according to the plurality of address signals and a p-channel transistor providing a power supply voltage for the node, a gate electrode of the p-channel transistor connecting with a ground line when the node connects with the ground line and receiving a voltage having a predetermined level intermediate a level of the power supply voltage and a level of the ground line, when the node is cut off from the ground line, wherein the decoded signal changes according to a voltage level of the node.

12 Claims, 10 Drawing Sheets

Fig. 1

Fig. 2     ADDRESS INITIAL-STAGE CIRCUIT

DECODER CIRCUIT

BACKGROUND OF THE INVENTION

1. Field of the Invention

The present invention relates to a decoder circuit, and more particularly, to a predecoder circuit positioned between an address decoder circuit and another decoder circuit in a semiconductor memory device.

2. Description of the Related Art

In recent years, a semiconductor memory device, which performs a high-rate operation, has played a large role in rapidly enhancing the performance of a personal computer and a workstation.

The semiconductor memory device includes an address decoder circuit, a predecoder circuit, and a decoder circuit, and these circuits select a word line as described later.

Figure 14:
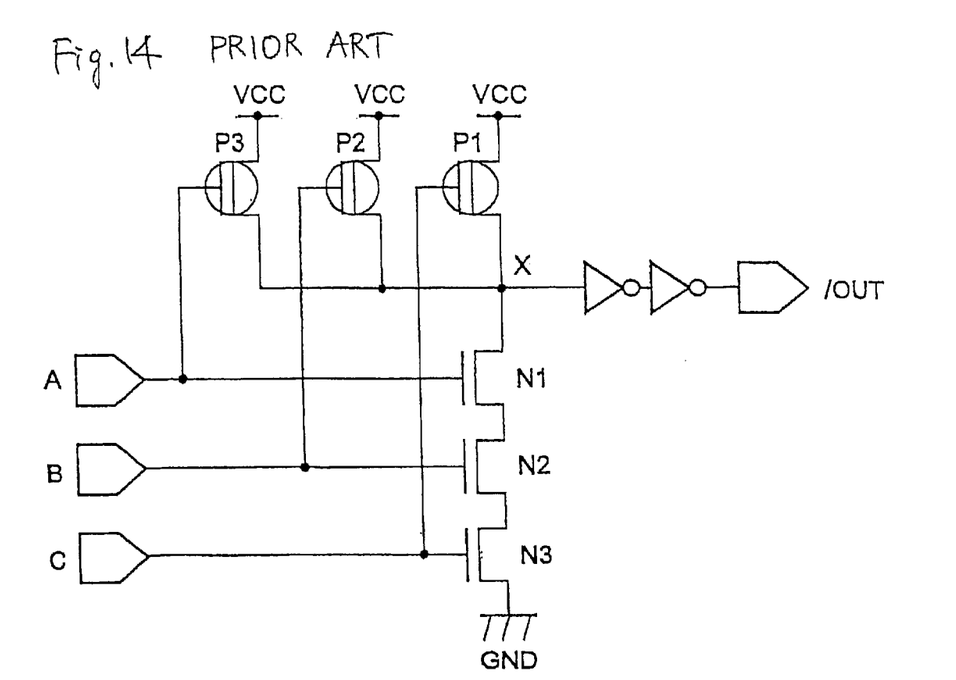
FIG. 14 is a circuit diagram showing an example of a conventional predecoder circuit.

One example of a conventional predecoder circuit will be described with reference to FIG. 14. FIG. 14 shows an example in which three addresses are inputted, and this predecoder circuit includes first to third P channel (Pch) transistors P1 to P3 and first to third N channel (Nch) transistors N1 to N3.

Input signals A, B, and C are applied as address signals. When the potential levels of the address signals A, B, and C are "high levels (H)", the first to third Nch transistors N1 to N3 are placed in an ON state, and the first to third Pch transistors P1 to P3 are placed in an OFF state. As a result, the charge of a node X is discharged to GND. Moreover, the potential of an output /OUT has a low level (L). That is, the output /OUT is in a selection state.

When at least one of the address signals A, B, and C has a "L" level, at least one of the first to third Nch transistors N1 to N3 is in the OFF state, so that the path between the node X and GND is interrupted. On the other hand, when at least one of the first to third Pch transistors P1 to P3 is in the ON state, the node X is charged with an electric charge from a power supply Vcc, and becomes the "H" level. The output/OUT becomes "H" level, that is, a non-selection state.

Another example of the conventional predecoder circuit will next be described with reference to FIG. 15. The depicted predecoder circuit uses a Pch transistor P1 whose gate electrode connects to GND. Therefore, the Pch transistor P1 is normally on. The predecoder circuit is provided with the address signals A, B, and C in a similar manner as the predecoder circuit shown in FIG. 14. As described with reference to FIG. 14, when the potentials of the address signals A, B, and C are "H", the first to third Nch transistors N1 to N3 are in the ON state. As a result, the charge supplied to the node X via the Pch transistor P1 is discharged to GND. The potential of the node X results in "L" level, and the output/OUT results in the "L" level, that is, the selection state.

On the other hand, when at least one of the address signals A, B, and C is the "L" level, at least one of the first to third Nch transistors N1 to N3 is placed in the OFF state, so that the path between the node X and GND is interrupted. The potential of the node X results in "H" level by the charge supplied to the node X via the normally on Pch transistor P1. Subsequently, the output /OUT assumes the "H" level, that is, the non-selection state.

Another example of a conventional predecoder circuit will now be described with reference to FIG. 16. The depicted predecoder circuit uses a source drive system. When the potentials of the address signals A and B become "H", the first and second Nch transistors N1 and N2 are placed in the ON state. On the other hand, an address signal /C which is an opposite-phase signal of the address signal C is inputted to the source of the second Nch transistor N2 at the "L" level. The potential of the node X results in "L". Subsequently, the output /OUT results in the "L" level, that is, the selection state.

When at least one of the address signals A and B is the "L" level, the path between the second Nch transistor N2 and the node X is interrupted. Then, the potential of the node X results in "H" by the charge supplied to the node X via the normally-on Pch transistor P1. Subsequently, the output /OUT assumes the "H" level, which is the non-selection state.

Additionally, when the first and second Nch transistors N1 and N2 are in the ON state, and the potential of the address signal /C is "H", the node X results in the "H" level by the "H" level of the address signal /C and the charge supplied to the node X via the normally-on Pch transistor P1. The output /OUT results in the non-selection state of the "H" level.

Figure 15:
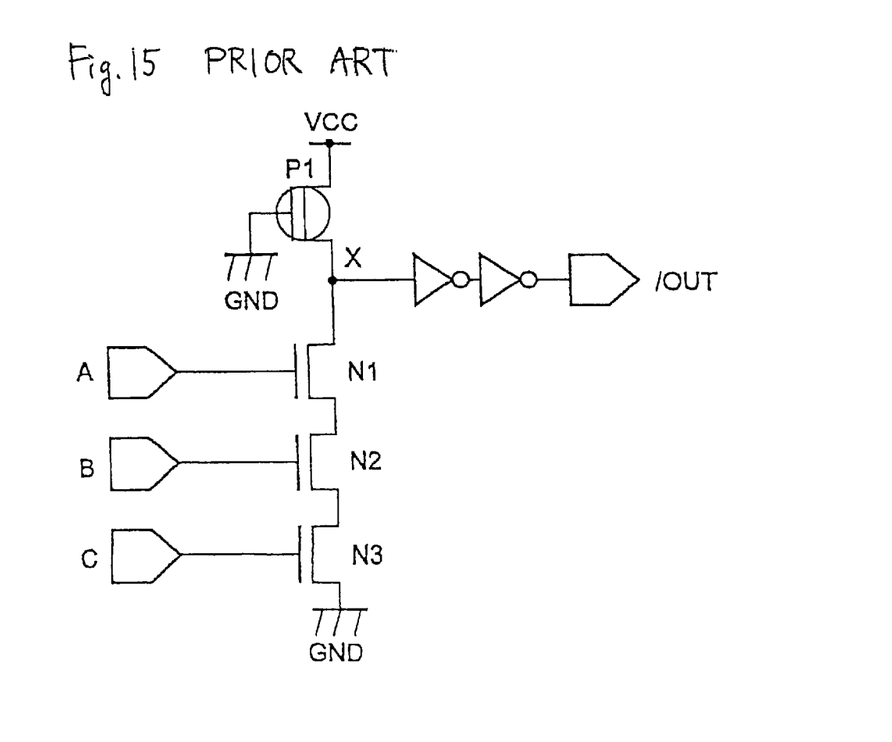
FIG. 15 is a circuit diagram showing another example of a conventional predecoder circuit.
Figure 16:
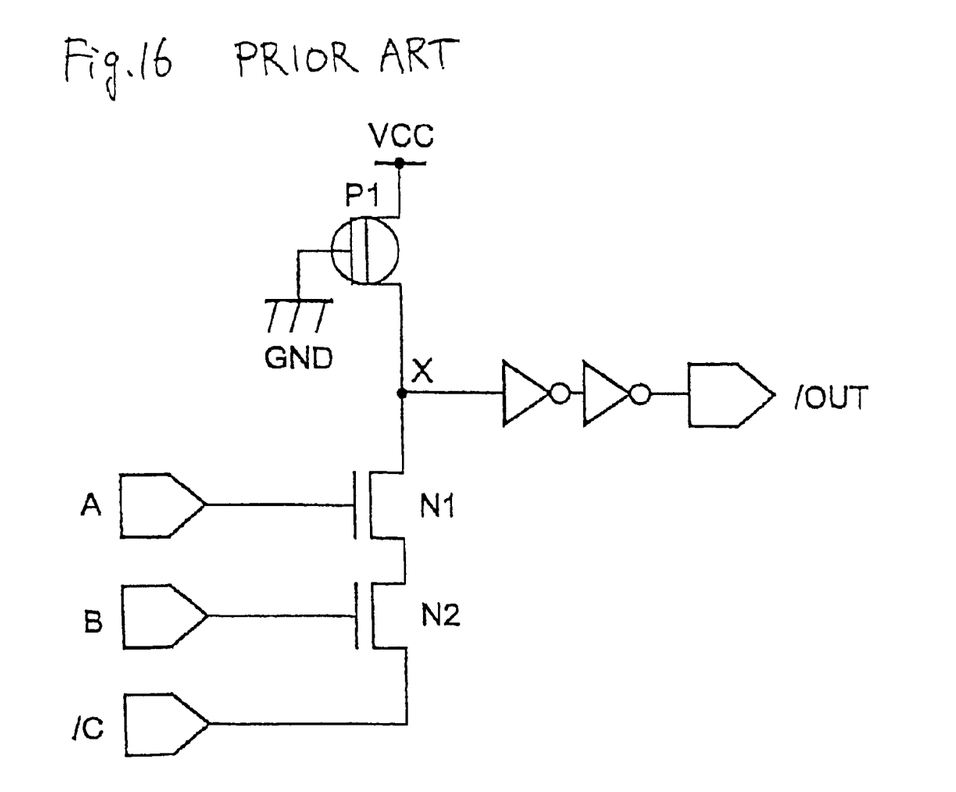
FIG. 16 is a circuit diagram showing still another example of a conventional predecoder circuit.

In the predecoder circuits shown in FIGS. 14, 15 and 16, in order to adjust the switching speed from selection state to non-selection state and back again, the gate width ratio of the Pch/Nch transistors is changed. However, when the gate width of the Nch transistor is enlarged, or the gate width of the Pch transistor is reduced, in order to increase the switching speed from the non-selection state to the selection state, conversely, the switching speed from the selected state to the non-selection state is decreased, and undesired multi-selection may occur. Therefore, the predecoder circuits shown in FIGS. 14, 15 and 16 have a problem that it is difficult to increase the selection speed.

Furthermore, in the predecoder circuit shown in FIG. 16, a signal line with a large capacity load is used as a source input in order to increase the speed. In the predecoder circuit shown in FIG. 16, however, since amplification is fully performed in an output stage, the charge has to be discharged to the GND level from the Vcc level during selection, thereby slowing down the selection speed. This also applies to the predecoder circuit shown in FIGS. 14 and 15.

In the above-described predecoder circuit, since the P/N ratio is constant in accordance with a dimension during the switch to the selection state from the non-selection state, it is difficult to increase the selection speed without delaying the switching from the selection state to the non-selection state.

SUMMARY OF THE INVENTION

An object of the present invention is to provide a predecoder circuit which can increase both changing speeds from selection state to non-selection state and from non-selection state to selection state without causing multi-selection.

In order to accomplish this object, according to the present invention, there is provided a decoder circuit, which decodes a plurality of input address signals to output a decoded signal on an output terminal, comprising a switch circuit that receives the address signals and connects a node to a ground line or cuts off the node from the ground line according to the plurality of address signals, and a p-channel transistor providing a power supply voltage for the node, a gate electrode of the p-channel transistor connecting with a ground line when the node connects with the ground line and receiving a voltage having a predetermined level intermediate a level of the power supply voltage and a level of the ground line, when the node is cut off from the ground line, wherein the decoded signal changes according to a voltage level of the node.

According to the present invention, it is possible to increase both switching speeds from selection state to non-selection state and from non-selection state to selection state.

BRIEF DESCRIPTION OF THE DRAWINGS

The above and other objects, features, and advantages of the present invention will become more apparent from the following detailed description when taken in conjunction with the accompanying drawings wherein.

DETAILED DESCRIPTION OF THE PREFERRED EMBODIMENTS

Figure 1:
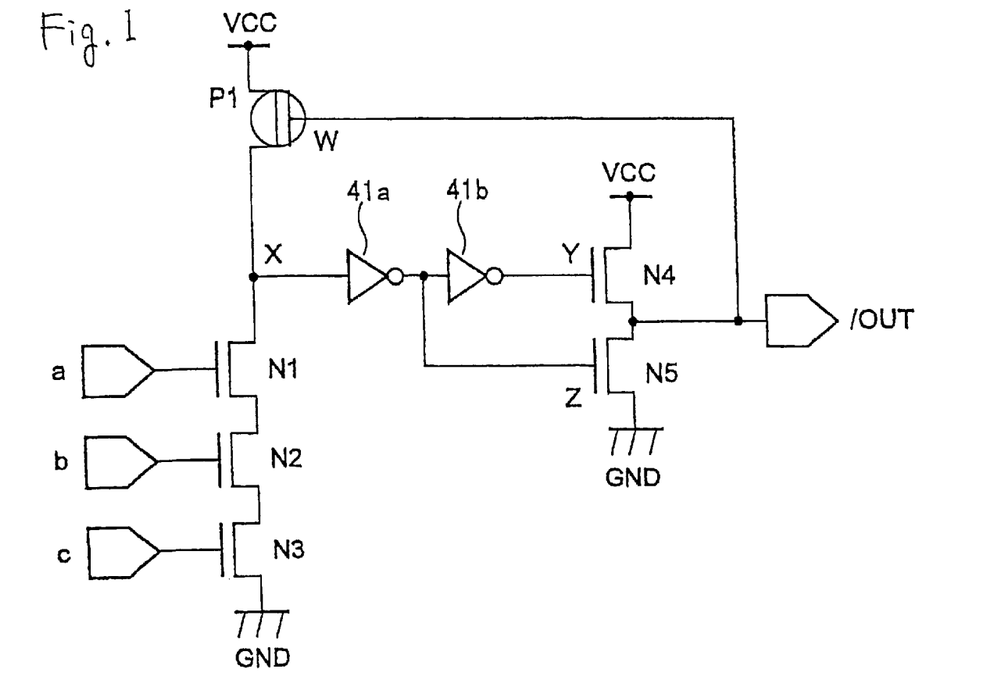
FIG. 1 is a circuit diagram showing a first embodiment of a predecoder circuit of the present invention.

As shown in FIG. 1, this predecoder circuit includes first to fifth Nch transistors N1 to N5 and a Pch transistor P1, receives address signals from the address decoder circuit, and outputs an output signal /OUT.

Figure 2:
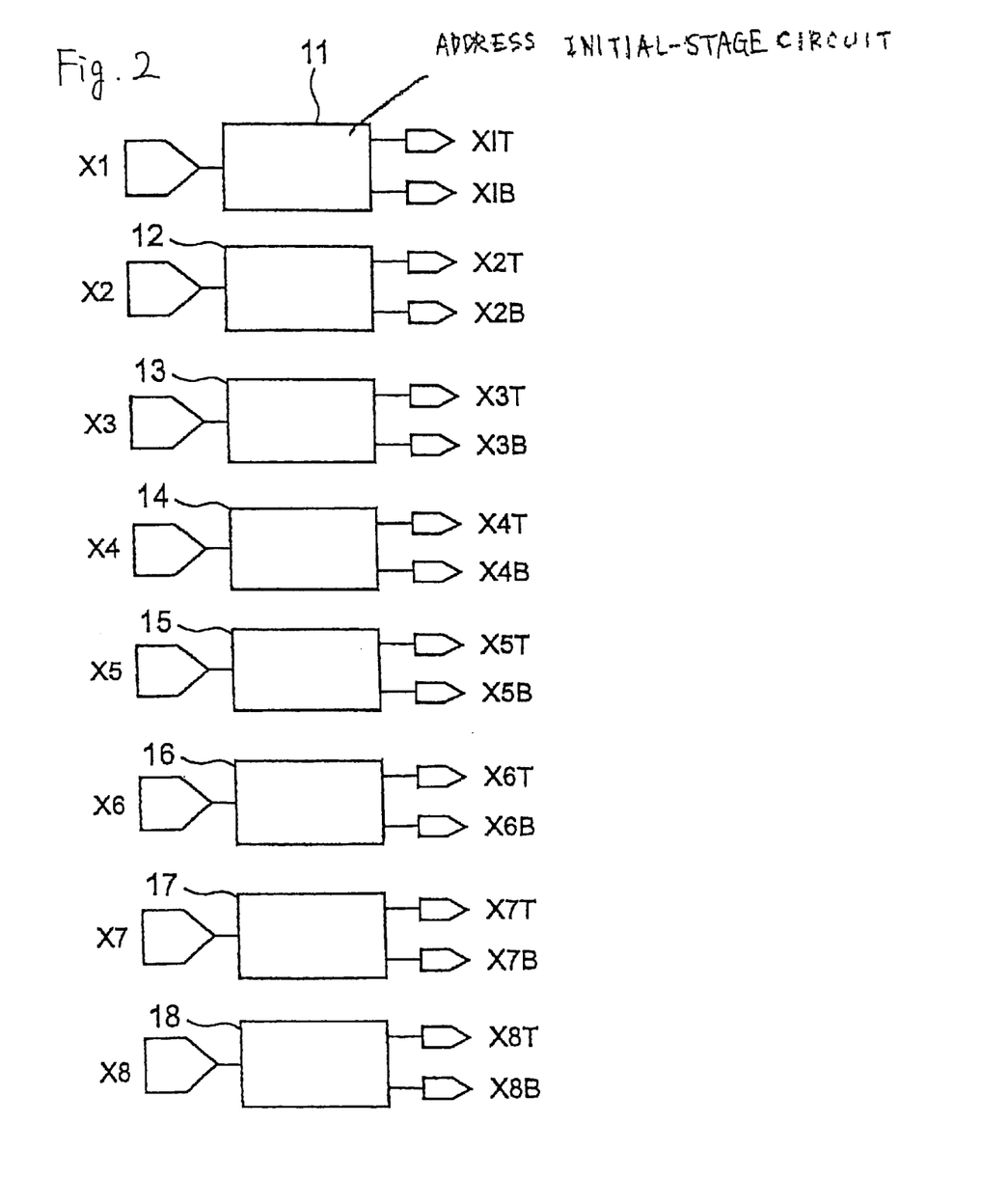
FIG. 2 is a diagram showing one example of an address initial-stage.

Here, with reference to FIG. 2, it is now assumed that the number of cells per digit is 1024. An external circuit (control circuit) feeds addresses X1 to X8 to address initial-stage circuits 11 to 18, and the address initial-stage circuits 11 to 18 output True and Bar signals necessary for decoding. In this example, the True signal and the Bar signal outputted from the address initial-stage circuit 11 are represented by X1T and X1B, and the True signal and the Bar signal outputted from the address initial-stage circuit 12 are represented by X2T and X2B, respectively. Specifically, the True signal and the Bar signal outputted from the address initial-stage circuit in (n being an integer of 1 to 8) are represented by XnT and XnB, respectively. Subsequently, the True signal XnT and the bar signal XnE are fed to the address decoder circuit.

Figure 3:
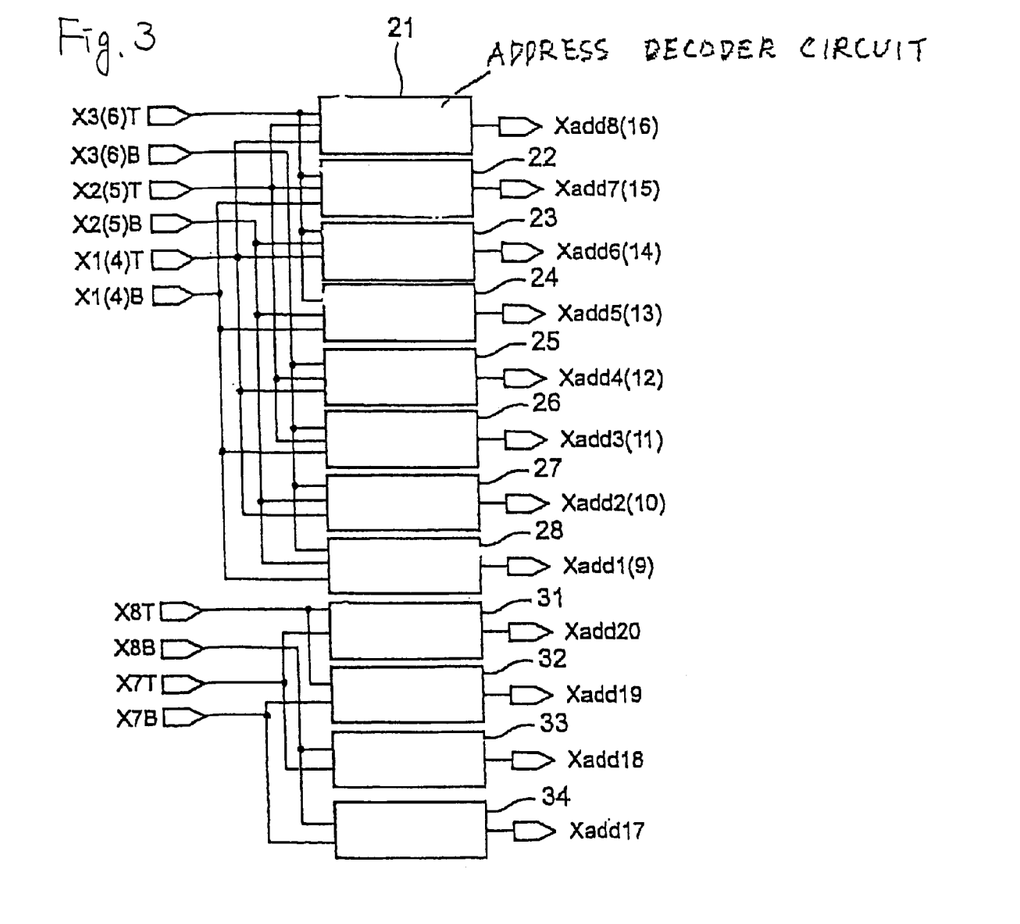
FIG. 3 is a diagram showing one example of an address decoder circuit constitution positioned in a front stage of the predecoder circuit and next stage of the address initial stage circuit.

Referring to FIG. 3, 20 address decoder circuits are actually present, but only 12 address decoder circuits 21 to 28 and 31 to 34 are shown in FIG. 3. The circuits not shown are hereinafter referred to as the omitted address decoder circuits.

As shown in FIG. 3, the address decoder circuit 21 is provided with True signals X3T, X2T, and X1T, and outputs an address signal Xadd8. Similarly to the address decoder circuit 21, the omitted address decoder circuit is provided with True signals X6T, X5T, and X4T, and outputs an address signal Xadd16.

Specifically, as shown in FIG. 3, the True signals X1T to X8T and bar signals X1B to X8B are fed to the address decoder circuits 21 to 28, address decoder circuits 31 to 34, and omitted address decoder circuits, and address signals Xadd1 to Xadd20 are generated.

Figure 4:
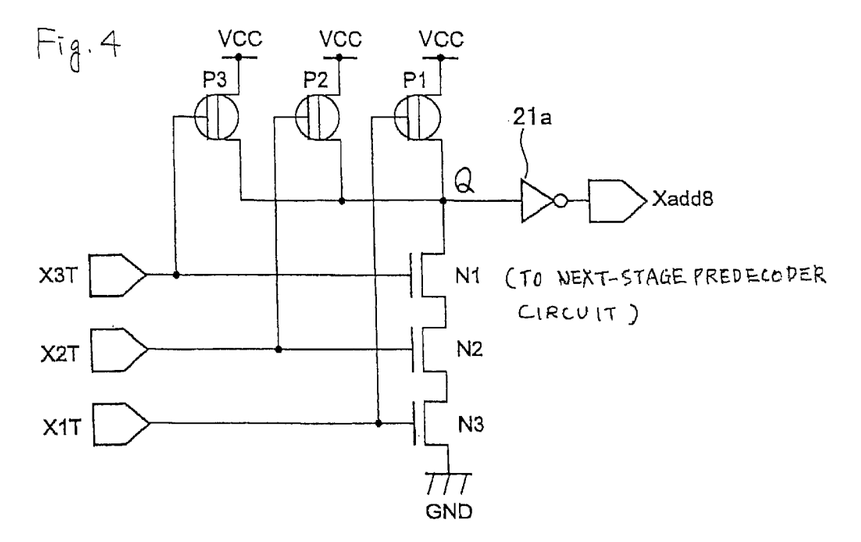
FIG. 4 is a circuit diagram showing one example of an address circuit shown in FIG. 3, in which there are three inputs.
Figure 5:
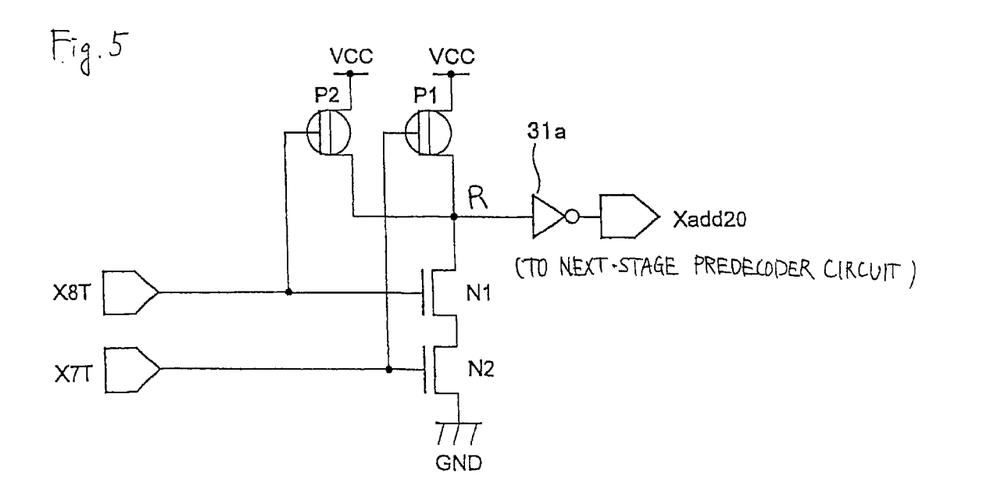
FIG. 5 is a circuit diagram showing one example of the address circuit shown in FIG. 3, in which there are two inputs.

Here, referring to FIGS. 4 and 5, the address decoder circuits 21 to 28 and omitted address decoder circuits include a circuit constitution shown in FIG. 4, and the address decoder circuits 31 to 34 include a circuit constitution shown in FIG. 5.

The address decoder circuit 21 is now noted, and as shown in FIG. 4, the address decoder circuit 21 includes first to third Pch transistors P1 to P3 and first to third Nch transistors N1 to N3. Moreover, a node Q is connected to an output end via an inverter 21a. The address decoder circuit 21 is reverse to the circuit shown in FIG. 14 in output phase, but performs the similar operation, and the description is therefore omitted.

The address decoder circuit 31 is next noted, and as shown in FIG. 5, the address decoder circuit 31 includes first and second Pch transistors P1 and P2 and first and second Nch transistors N1 and N2. Moreover, the node R is connected to the output end via an inverter 31a. Since the operation of the address decoder circuit 31 is similar to that of the address decoder circuit 21 except that there are two inputs, the description thereof is omitted.

Figure 6:
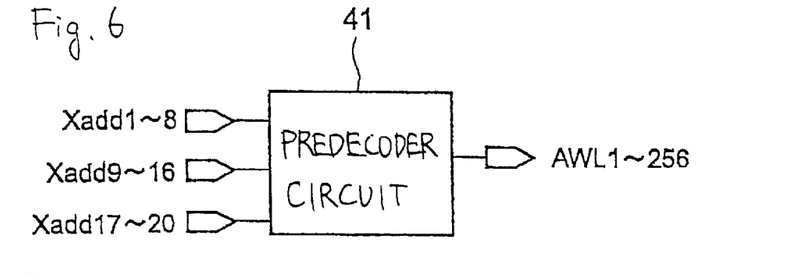
FIG. 6 is a diagram showing one example of the predecoder circuit constitution.

Referring to FIG. 6, the address signals Xadd1 to Xadd20 are fed to a plurality of predecoder circuits 41. In FIG. 6, only one predecoder circuit 41 is shown for the sake of convenience, but 1024 cells are assumed here, with respect to the address signals Xadd1 to Xadd20, combinations of the address signals Xadd1 to Xadd8, Xadd9 to Xadd16, and Xadd17 to Xadd20 are inputted to the plurality of predecoder circuits 41, and the number of predecoder circuits 41 results in 8×8×4=256 circuits.

Returning to FIG. 1, this shows one of the predecoder circuits 41, and the input address signals are those outputted from the previous-stage address decoder circuits, S and are represented by a, b, and c. Additionally, as described later, only one predecoder circuit is selected from a plurality of predecoder circuits 41 by the combination of the address signals.

This predecoder circuit shown in FIG. 1 includes the fourth and fifth Nch transistors N4 and N5 (hereinafter referred to as NN type), which are used as pull-up and pull-down sides in an output stage of this circuit, so that the amplitude of the output signal is lowered and the selection speed is increased as described later. Furthermore, the is output signal is fed back to the gate of the Pch transistor P1, the Pch transistor P1 being used as the normally-on Pch transistor, and the switching speed to the selection state is increased without retarding the switching speed to the non-selected state.

Figure 7:
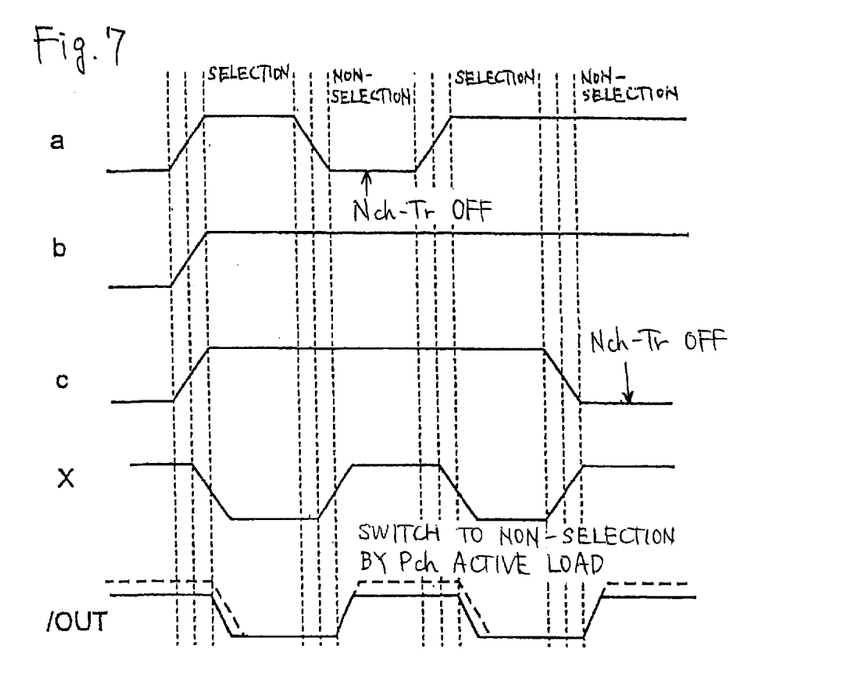
FIG. 7 is a waveform diagram for comparing the operation of the predecoder circuit shown in FIG. 1 with that of a conventional predecoder circuit.

The operation of the predecoder circuit shown in FIG. 1 will now be described with reference to FIG. 7. Additionally, in the output /OUT of FIG. 7, a solid line shows the output of the predecoder circuit shown in FIG. 1, and a broken line shows the output of the conventional predecoder circuit for comparison.

When at least one of the address signals a, b, and c (e.g., the address signal a) has "L" level, the first Nch transistor N1 is placed in the OFF state, and the node X becomes "H" level by a charge supplied from a power supply Vcc via the normally-on Pch transistor P1.

Since the node X is connected to a node Y via first and second inverters 41a and 41b, and further connected to a node Z via the first inverter 41a, the node Y assumes the "H" level, and the node Z assumes the "L" level. Then, the fourth Nch transistor N4 turns ON, the fifth Nch transistor N5 turns OFF, and an Nch step drop (Vcc-Vtn) level (non-selection "H") is outputted to "/OUT" (wherein Vtn indicates a threshold voltage of the Nch transistor).

The output is fed back to the Pch transistor (Pch active load) P1, such that the gate of the Pch transistor P1 is provided with the Nch step drop (Vcc-Vtn) level voltage, whereupon the conductance of the Pch transistor P1 is lowered but its ON state is held.

When all of the address signals a, b, and c are "H" level, the first to third Nch transistors N1 to N3 are ON. The charge of the node X is thereby discharged to GND. In this case, since the conductance of the Pch transistor P1 is lowered as described above, the charge of the node X is easily discharged via the first to third Nch transistors N1 to N3, and the potential of the node X more readily reaches the "L" level.

When the node X obtains the "L" level as described above, the node Y assumes the "L" level, and the node Z becomes "H" level. The fourth Nch transistor N4 therefore turns OFF, the fifth Nch transistor N5 turns ON, and the output /OUT goes to GND level. In this case, since the charge may be discharged to the GND level from the Nch step drop (Vcc-Vt) level, the speed of selection "L" can be increased as compared with a case in which the charge is discharged to the GND level from Vcc.

When the output is fed back to the Pch transistor (Pch active load) P1, the gate of the Pch transistor P1 is provided with the GND level, the conductance of the Pch transistor P1 is enhanced and its ON state is held.

In this state, even when at least one of the address signals a, b, c (e.g., the address signal a) goes to the "L" level, the conductance of the Pch transistor (Pch active load) P1 is enhanced. Furthermore, since the Pch transistor P1 has the normally-on state, the non-selection is not retarded.

Since the Pch active load P1 operates as the normally-on Pch transistor as described above, the switching speed to the non-selection state from the selection state is not retarded. Therefore, the gate width of the Pch transistor P1 can be minimized.

Figure 8:
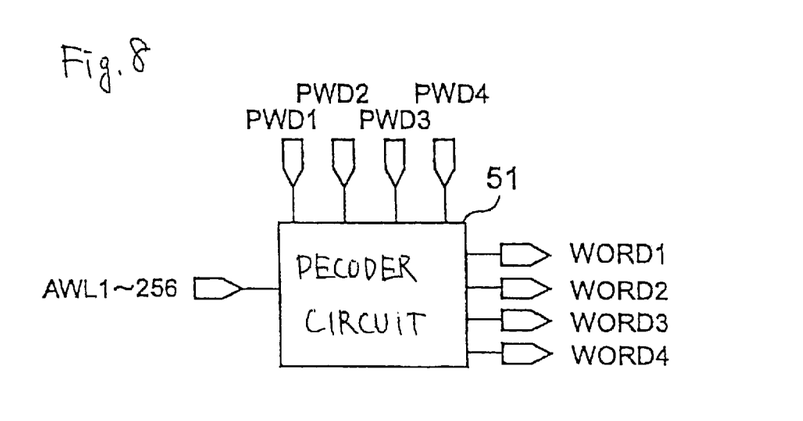
FIG. 8 is a diagram showing one example of a decoder circuit constitution positioned in the next stage of the predecoder circuit.

Here, referring to FIG. 8, a plurality of predecoder circuits 41 output predecoder output signals AWL1 to AWL256 as described above. These predecoder output signals AWL1 to AWL256 are fed to a plurality of decoder circuits 51. In FIG. 8, only one decoder circuit 51 is shown for the sake of convenience, but 256 decoder circuits 51 are actually present. A control circuit (not shown) feeds control signals PWD1 to PWD4 to the respective decoder circuits 51, and the respective decoder circuits 51 output word selection signals WORD1 to WORD4. Since the word selection signals WORD1 to WORD4 are present for the respective predecoder output signals AWL1 to AWL256, either one is selected from 256×4=1024 cells.

Figure 9:
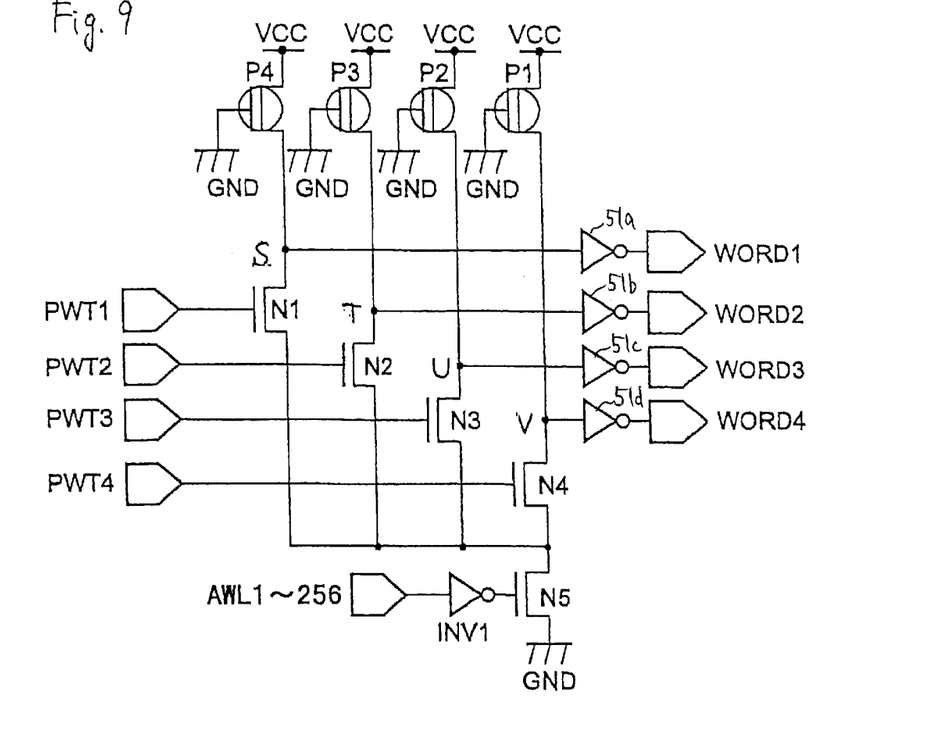
FIG. 9 is a circuit diagram showing one example of the decoder circuit shown in FIG. 8.

Referring to FIG. 9, the output from only one selected predecoder circuit is inputted to the next-stage decoder circuit 51, and the word selection is performed in accordance with the outputs (WORD1 to 4) of the decoder circuit.

In the decoder circuit 51, when the NN type transistor is used in the output stage as in the predecoder circuit and the amplitude of the output is lowered, the output is used as a gate input (Vg) to the transfer gate of a memory cell during the word selection, and the transistor conductance is deteriorated. Therefore, the output-stage circuit is constituted such that the NN type is not used.

The decoder circuit 51 shown in FIG. 9 includes first to fifth Nch transistors N1 to N5 and first to fourth Pch transistors P1 to P4. The selected predecoder circuit 41 transmits the "L (selection)" level to the decoder circuit 51. Specifically, as shown in FIG. 9, the "H" level is fed to the gate of the fifth Nch transistor N5 via an inverter INV1.

On the other hand, the control signals PWD1 to PWD4 are fed to the first to fourth Nch transistors N1 to N4. Nodes S, T, U and V are connected to the output terminals of word selection signals WORD1, WORD2, WORD3, and WORD4 via inverters 51a, 51b, 51c, and 51d. In the decoder circuit 51 shown in FIG. 9, when any one of the control signals PWT1 to PWT4 is selected and goes to the "H (selection)" level, any one of the word selection signals WORD1 to WORD4 goes to the "H (selection)" level. The word selection signal at H level is used as the gate input to the transfer gate of the memory cell, and the memory cell is selected.

Figure 10:
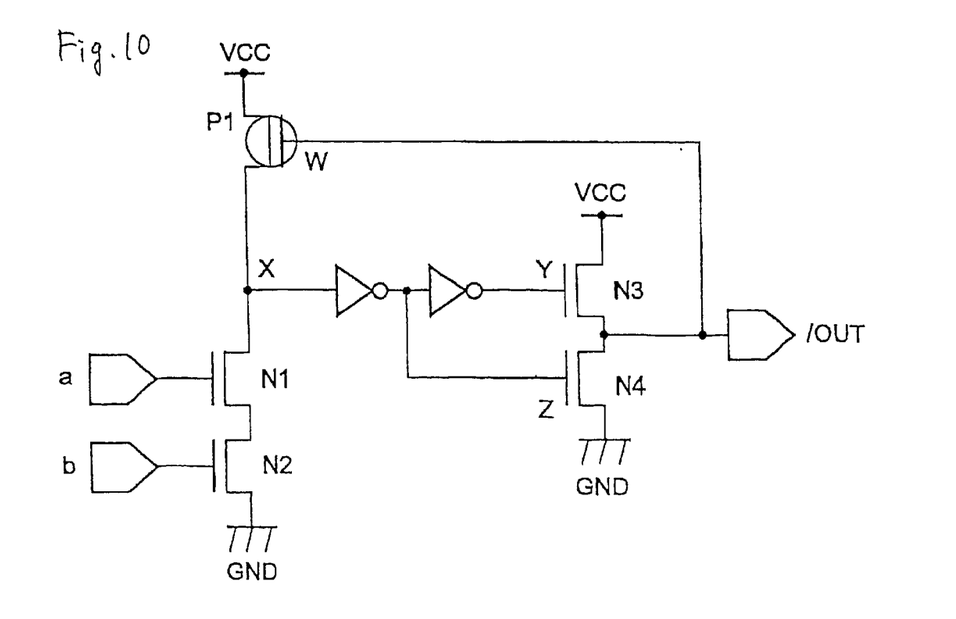
FIG. 10 is a diagram showing a second embodiment of the predecoder circuit according to the present invention, in which there are two inputs.

In the predecoder circuit, the number of input addresses is not limited to three as shown in FIG. 1; instead, a circuit in which the number of input addresses is two as shown in FIG. 10 can be constituted in a similar manner as FIG. 1, and a circuit in which the number of input addresses is four or more can also be constituted in a similar manner as FIG. 1.

For example, in the predecoder circuit shown in FIG. 10, when the address signals a and b as the gate inputs to the first and second Nch transistors N1 and N2 have the "H" level, the output /OUT of the predecoder circuit has the "L" level (the selection state).

Figure 11:
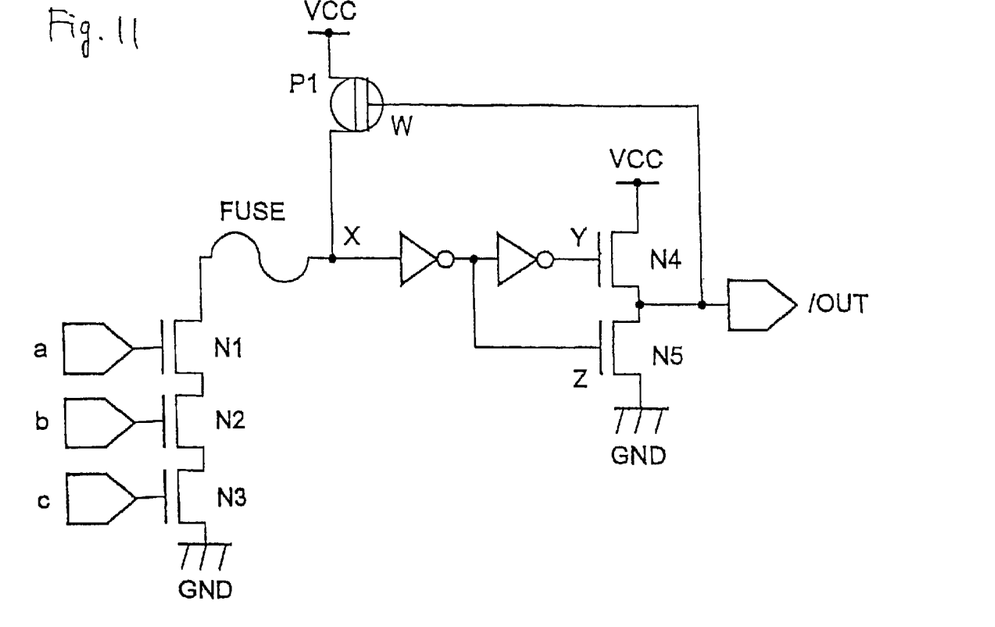
FIG. 11 is a diagram showing a third embodiment of the predecoder circuit of the present invention, which is used in redundancy.

Furthermore, by connecting the node X to the first Nch transistor N1 via FUSE as shown in FIG. 11, the path from the input address signal is interrupted, and the circuit can be used for redundancy. Specifically, in the circuit shown in FIG. 11, when the FUSE is cut, the node X constantly has the "H" level, because the Pch active load P1 is in the normally-on state irrespective of the input voltages of the address signals a, b, and c outputted from the address decoder circuit.

Then, the node Y goes to the "H" level, the node Z goes to the "L" level, the output-stage Nch transistor N4 turns ON, and the Nch transistor N5 turns OFF. Therefore, Vcc-Vtn (the Vt step drop level of the Nch transistor) is outputted as the output /OUT and results in the non-selection state.

This output is fed back to the Pch active load P1, and the conductance of the Pch transistor is deteriorated, but the Pch transistor has the normally-on state, the charge is constantly fed to the node X from the power supply Vcc and the "H" level is held. As a result, this circuit performs a circuit operation so that the output maintains the non-selection state.

As is apparent from the above description, when the fuse is cut, this circuit necessarily holds the non-selection state.

Figure 12:
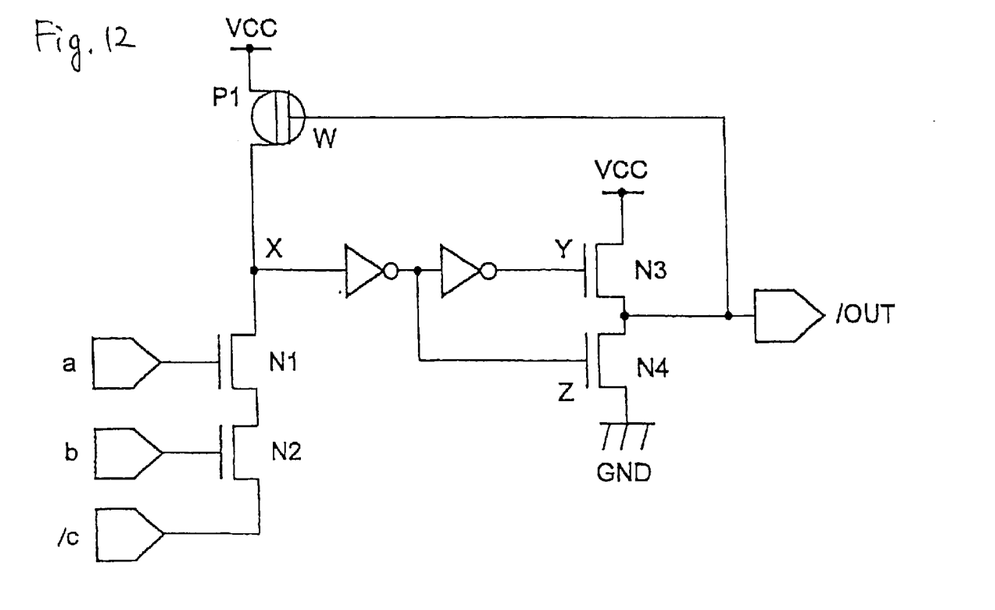
FIG. 12 is a diagram showing a fourth embodiment of the predecoder circuit of the present invention, which uses a source drive system.

Referring to FIG. 12, one of the inputs ("/C" in this example) from the address decoder circuit is used as a source input. An address signal /C has a phase opposite to the phase of the other address signals a and b, and is generated in the address decoder circuit so that the "L" level results in the non-selection.

Transistor parasitic capacity includes gate capacity and diffusion layer capacity, and the comparison of the gate capacity with the diffusion layer capacity shows that in this embodiment the diffusion layer capacity becomes smaller than the gate capacity. Therefore, for a signal line with a large transistor gate load with respect to the address signal, by the gate input, the capacity load can be reduced, and the speed can be increased.

First, the non-selection state of the predecoder circuit shown in FIG. 12 will be described.

When the input (address signals) to the predecoder circuit source is set to /c=H (non-selection) level, and the other input signals are set to a=b=H (selection) level, the first and second Nch transistors N1 and N2 turn ON, and the H (non-selection) level applied to the source of the second Nch transistor N2 and the charge applied from the power supply Vcc via the normally-on Pch transistor P1 place the node X at the H level.

Then, the node Y becomes H level, the node Z becomes L level, the output-stage third Nch transistor N3 turns ON, the fourth Nch transistor N4 turns OFF, and the Nch step drop (Vcc-Vtn) level (non-selection "H") is outputted via /OUT.

When this output is fed back to the Pch active load P1, the gate is provided with the Nch step drop (Vcc-Vtn) level voltage, and the conductance of the Pch transistor is deteriorated but the ON state is held.

The selection state will now be described.

The gate input signals of the first and second Nch transistors N1 and N2 remain in a=b=H (selection), the source input of the second Nch transistor N2 is set to /C=L (selection), then the first and second Nch transistors N1 and N2 remain in the ON state, and the conductance of the Pch transistor P1 is deteriorated as described above, and the charge of the node X readily assumes the L level via the first and second Nch transistors N1 and N2, so that the speed can be increased.

When the node X goes to the L level, the node Y goes to the L level, the node Z goes to the H level, the third Nch transistor N3 turns OFF, the fourth Nch transistor N4 turns ON, and the /OUT goes to the GND level. In this case, since the charge may be discharged to the GND level from the Nch step drop level (Vcc-Vt), the speed of selection "L" can be increased as compared with when the charge is discharged to the GND level from Vcc.

When this output is fed back to the Pch active load P1, the gate is provided with the GND level, the conductance of the Pch transistor is therefore enhanced and the ON state is held.

Now, a non-selection state different from the above-described non-selection state will be described.

When the input to the source of the second Nch transistor N2 remains in /c=L (selection), and at least one of the inputs to the gates of the first and second Nch transistors N1 and N2 is switched to L (non-selection) (e.g., the address signal a=L), the path between the node X and the source of the second Nch transistor N2 is interrupted. On the other hand, since the Pch active load P1 with the enhanced conductance holds the ON state, the switch to non-selection is not retarded, the charge is fed to the node X via the Pch active load P1 from the power supply Vcc, and the node X goes to the H level.

Therefore, the node Y goes to the "H" level, the node Z goes to the L level, the third Nch transistor N3 turns ON, and the fourth Nch transistor N4 turns OFF. As a result, the Nch step drop (Vcc-Vtn) level (non-selection "H") is outputted to /OUT.

When this output is fed back to the Pch active load P1, the gate is provided with the voltage of the Nch step drop level, and the conductance of the Pch transistor P1 is therefore deteriorated but the ON state is held.

The above-described operation is in the same state as the non-selection state in which all the inputs to the gates of the first and second Nch transistors N1 and N2 are H (selection), and the input to the source of the second Nch transistor N2 is /c=H (non-selection).

Since the Pch active load P1 operates as the normally-on Pch transistor as described above, the switch to the non-selection state from the selection state is not retarded, and the gate width of the Pch transistor P1 can be minimized.

Moreover, by inputting the signal line with the large transistor gate load as the input to the source of the second Nch transistor N2, the capacity load can be reduced, and the effect of the speed increase is enlarged.

Figure 13:
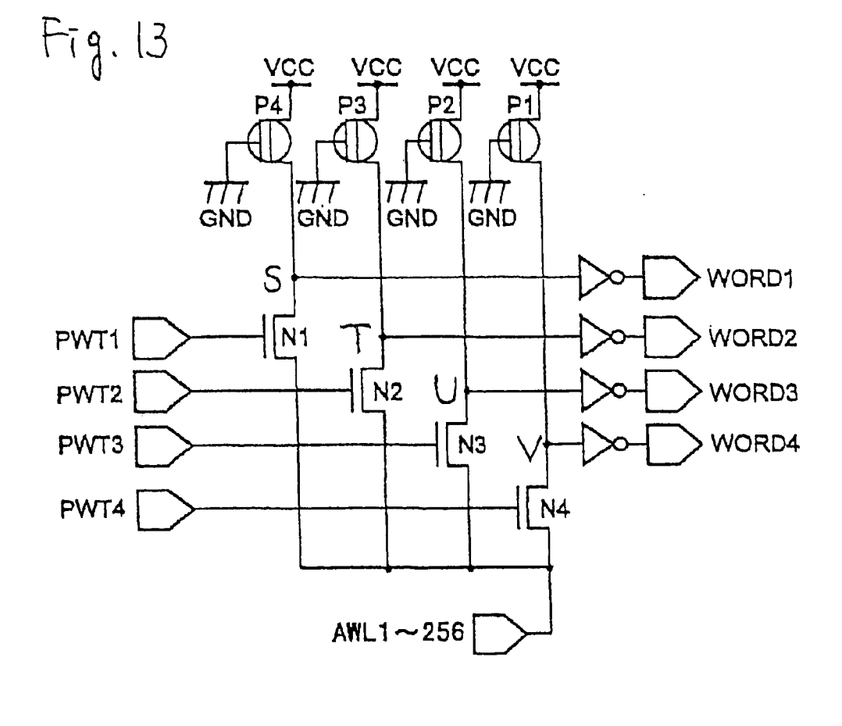
FIG. 13 is a diagram showing another example of the decoder circuit shown in FIG. 8.

As shown in FIG. 12 the source drive system is used in the predecoder circuit, and similarly the source drive system can also be used in the decoder circuit as shown in FIG. 13.

When the source drive system shown in the predecoder circuit of FIG. 12 is used in the decoder circuit shown in FIG. 9, the output during the non-selection constantly has the Nch step drop (Vcc-Vtn) level, and a through current flows to the inverter circuit INV1 of the decoder circuit. However, when the decoder circuit of the source drive system is used as shown in FIG. 13, the through current is prevented. Additionally, as shown in FIG. 12, for the signal line with the large transistor gate load with respect to the input signal, by applying the source input rather than by applying the gate input, the capacity load can be reduced and the operation speed can be increased.

Here, the relative comparison in operation speed of the conventional predecoder circuit (FIGS. 14 and 16) with the predecoder circuit of the present invention (FIG. 12) is shown in Table 1.

TABLE 1

Relative Comparison of Operation Speed by Type

| Type | Selection | Non-selection (unit: ns) |
|---|---|---|
| FIG. 14 | 0.00 | 0.00 |
| FIG. 16 | −0.20 | −0.60 |
| FIG. 12 | −0.35 | −0.60 |

As shown in Table 1, it is seen that in the predecoder circuit shown in FIG. 12, as compared with the circuit shown in FIGS. 14 and 16, the speed increase of 0.15 ns is realized on the selected side without retarding the switch to the non-selection. For the memory products in recent years, the operation frequency is high speed, and the speed increase of 0.15 ns is equivalent to the speed increase to ten and some percentages from several percentages of a cycle width.

As described above, the present invention provides an effect that the amplitude of the output is lowered and the selection speed can be increased. Furthermore, since the conductance of the transistor is lowered during the non-selection by feeding the Nch step drop (Vcc-Vtn) level back to the gate of the Pch active load to operate the Pch active load as the normally-on Pch transistor, the switch to the selection from the non-selection can effectively be performed at a high speed.

Furthermore, in the present invention, during the selection, since the GND level is fed back to the gate of the Pch active load, the conductance of the Pch transistor is enhanced. During the switch to the non-selection from the selection, the switch is not retarded.

As described above, the present invention provides an effect that the switching speed to the selection state can be increased without retarding the switching speed to the non-selection state.

The present invention is not limited by the embodiments and it is obvious that many other embodiments could be adopted within the spirit and the scope of the present invention.

What is claimed is:

1. A decoder circuit, which decodes a plurality of input address signals to output a decoded signal on an output terminal, comprising:
    a switch circuit that receives said address signals and connects a node to a ground line or cuts off said node from said ground line according to said plurality of address signals; and
    a p-channel transistor providing a power supply voltage for said node, a gate electrode of said p-channel transistor connecting with the ground line when said node connects with said ground line and receiving a voltage having a predetermined level intermediate a level of said power supply voltage and a level of said ground line, when said node is cut off from said ground line;
    wherein said decoded signal changes according to a voltage level of said node.

2. The decoder circuit as claimed in claim 1, wherein when all of said plurality of address signals become high level, said node and said decoded signal become low level.

3. The decoder circuit as claimed in claim 1, wherein said gate electrode of said p-channel transistor receives said decoded signal.

4. The decoder circuit as claimed in claim 1, further comprising first and second inverters and first and second n-channel transistors, an input terminal of said first inverter connecting with said node, an output terminal of said first inverter connecting with an input terminal of said second inverter and a gate electrode of said second n-channel transistor, an output terminal of said second inverter connecting with a gate electrode of said first n-channel transistor, a drain electrode of said first n-channel transistor and a source electrode of said second n-channel transistor connecting with said output terminal, a source electrode of said first n-channel transistor receiving said power supply voltage and a drain electrode of said second n-channel transistor connecting with said ground line.

5. The decoder circuit as claimed in claim 4, wherein said drain electrode of said first n-channel transistor connects with said gate electrode of said p-channel transistor.

6. The decoder circuit as claimed in claim 1, wherein said switch circuit has a plurality of cascaded n-channel transistors, each gate electrode of said plurality of cascaded n-channel transistors receiving a respective one of said plurality of address signals.

7. The decoder circuit as claimed in claim 6, wherein said plurality of cascaded n-channel transistors connects said node to the ground line.

8. The decoder circuit as claimed in claim 6, wherein said plurality of cascaded n-channel transistors connects said node to a terminal, which receives an inverted signal of an address signal.

9. The decoder circuit as claimed in claim 1, further comprising a fuse between said node and said switch circuit.

10. The decoder circuit as claimed in claim 1, wherein said decoded signal is input to a further decoder circuit, said further decoder circuit receiving said decoded signal and control signals to output a word line selection signal.

11. The decoder circuit as clamed in claim 10, wherein said word line selection signal selects a word line of a memory cell array in a semiconductor memory device.

12. The decoder circuit as claimed in claim 1, wherein said plurality of address signals is generated from a plurality of external input address signals by an address decoder circuit.

* * * * *